United States Patent [19]
Schallenberger et al.

[11] Patent Number: 4,766,476
[45] Date of Patent: Aug. 23, 1988

[54] C-MOS TECHNOLOGY BASE CELL

[75] Inventors: Burghardt Schallenberger, Feldolling; Josef Stockinger, Munich; Paul Fuchs, Leinach, all of Fed. Rep. of Germany

[73] Assignee: Siemens Aktiengesellschaft, Berlin and Munich, Fed. Rep. of Germany

[21] Appl. No.: 703,711

[22] Filed: Feb. 21, 1985

[30] Foreign Application Priority Data

Jun. 19, 1984 [DE] Fed. Rep. of Germany ....... 3422715

[51] Int. Cl.⁴ .................... H01L 27/04; H01L 23/50; H01L 23/52
[52] U.S. Cl. ........................ 357/42; 357/59; 357/71; 357/68; 357/45
[58] Field of Search .............. 357/42, 45, 59 G, 71 P, 357/68

[56]  References Cited

U.S. PATENT DOCUMENTS

| | | | |
|---|---|---|---|
| 3,646,665 | 3/1972 | Kim | 357/42 |
| 3,737,340 | 6/1973 | Maeda et al. | 357/71 S |
| 3,751,292 | 8/1973 | Kongable | 357/71 S |
| 4,033,797 | 7/1977 | Dill et al. | 357/42 |
| 4,249,193 | 2/1981 | Balyoz et al. | 357/45 |
| 4,392,150 | 7/1983 | Courreges | 357/71 S |
| 4,458,297 | 7/1984 | Stopper et al. | 357/45 |
| 4,523,216 | 6/1985 | Shiotari | 357/59 |
| 4,562,453 | 12/1985 | Noguchi et al. | 357/45 |
| 4,570,176 | 2/1986 | Kolwicz | 357/42 |

FOREIGN PATENT DOCUMENTS

| | | | |
|---|---|---|---|
| 58-164243 | 9/1983 | Japan | 357/45 |
| 58-222561 | 12/1983 | Japan | 357/45 |

OTHER PUBLICATIONS

CAD for VLSI, by H. G. Schwartzel, Springer Verlag 1982, pp. 63–76.

*Primary Examiner*—William D. Larkins
*Attorney, Agent, or Firm*—Hill, Van Santen, Steadman & Simpson

[57] ABSTRACT

Base cells are employed for construction of electronic circuits by use of CMOS technology. The base cells are formed of two transistors and of first interconnects and second interconnects positioned perpendicular to one another. The first interconnects are formed of polysilicon and run parallel to a same side edge of the transistors. The second interconnects are formed of metal and run either between the two transistors or over the two transistors. Desired electronic circuits can be constructed by electrical connection via contacts between the interconnects and the transistor electrodes, and by a multiple side-by-side positioning of the base cells. The base cell has a simple geometrical structure which can be defined with software. Individual base cells can be positioned side-by-side without great modifications in order to realize electronic circuits.

6 Claims, 2 Drawing Sheets

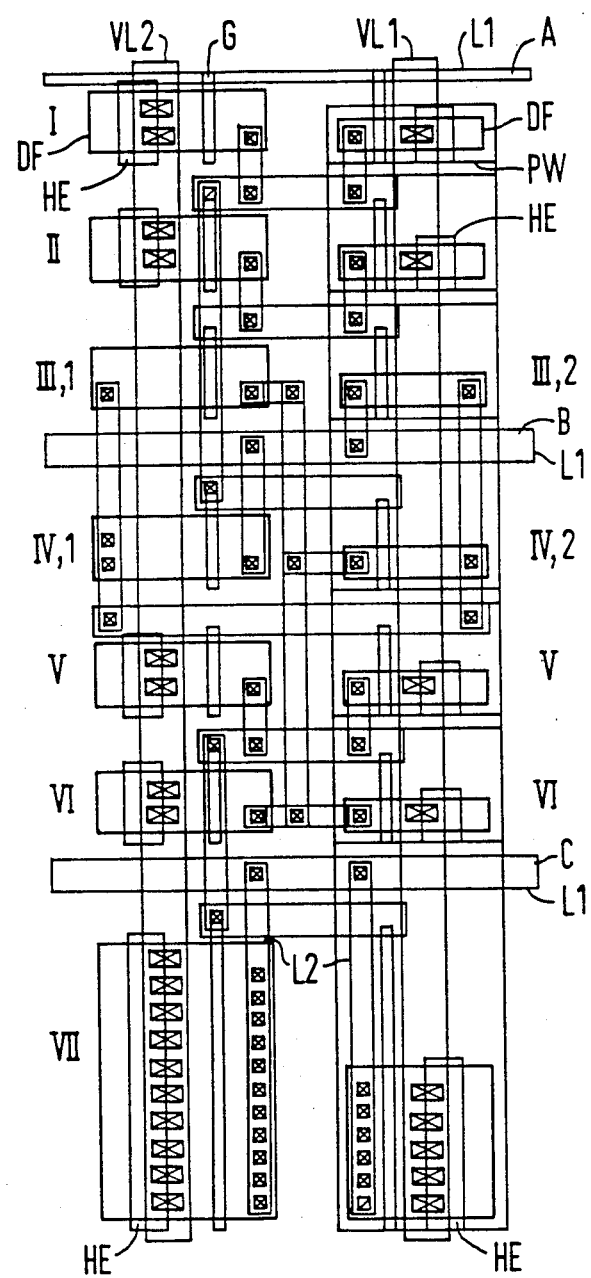

C-MOS TECHNOLOGY BASE CELL

BACKGROUND OF THE INVENTION

The invention relates to a CMOS technology base cell for the construction of electrical circuits.

The increasing complexity of VLSI electrical circuits makes manual design of the circuit layout increasingly more difficult. The great number of geometric discrete structures of a VLSI circuit forces a transition to automatic layout generation. Given such a layout generating method, the geometric layout structures are acquired from an abstract circuit specification with the assistance of software. The individual layout rectangles are thus dimensioned and placed by means of a program. The particular advantages of a layout generation by software are high flexibility, fast adaptation to new design rules, and short design times.

The overall layout of an electronic circuit is formed from a plurality of such layout rectangles. Given personal design of the electronic circuit, each rectangle is individually dimensioned and individually placed. Given such a method, however, the complexity is not reduced, so that layouts of larger circuits can only be produced with greater expense. The gate-matrix method, on the other hand, reduces the complexity of the circuit design since only certain grid points of a matrix are permitted for placing the geometric structures. According to the gate-matrix principle, layouts having the scope of standard cells are generated and subsequently are further processed with traditional methods. Another method of automatic layout generation is even applicable to extensive VLSI circuits, and reduces the complexity of the circuit design with the assistance of a base cell concept. A layout is constructed to a high degree from parametric base cells. The relative disposition of individual geometric structures to one another is prescribed within a base cell. Further methods for the production of electronic circuits can be derived, for example, from the brochure CAD for VLSI by H. G. Schwartzel, Springer Verlag 1982, for example, pages 63–76, incorporated herein by reference.

SUMMARY OF THE INVENTION

An object of the invention is to specify a base cell in CMOS technology which has a high wiring flexibility. This object is achieved by providing two transistors side-by-side; first interconnects composed essentially of polysilicon are positioned parallel to a side edge of the transistors. Second interconnects essentially composed of metal are disposed perpendicular to the first interconnects. The second interconnects run either over the transistors or between the transistors.

With the specified disposition of the interconnects relative to the transistors, any meaningful cell-internal wiring and lead guidance to the cell edge can be realized without the relative positions of the geometrical structures decisively changing.

In order to be able to vary the transistor width without influencing the cell width, it is expedient to dispose the gate of the transistors parallel to the second interconnects.

It is expedient to conduct the leads as second interconnects over the diffusion regions of the transistors, specifically between the gate of the respective transistor and the cell edge. A contact between a lead and a transistor electrode which may be potentially required can then occur with the assistance of a long contact which simultaneously contacts the substrate or the p-tub.

In order to achieve the optimally lowest electrode capacitances, the expanse of the source and the drain of the transistors is optimally small. For example, the expanse of the transistor electrode of the transistors directed toward the cell center is just as large as required for the acceptance of a contact. The transistor electrode oriented to the cell edge which is not connected to a lead is of just such size as is required for bypassing the lead and for contacting to a second interconnect.

Low connection resistances of the transistors are achieved since the connection of drain and source of the transistors to a second interconnect, a metal line, is produced via a plurality of contacts. This is possible due to the parallel disposition of the gates of the transistors and of the metal tracks.

A further advantage of the base cell of the invention is that the first interconnects of polysilicon which serve for the connection of the gate electrodes of the transistors can be disposed above or below the diffusion regions.

BRIEF DESCRIPTION OF THE DRAWINGS

FIG. 2 is a layout of a bistable circuit (latch) with employment of base cells.

DESCRIPTION OF THE PREFERRED EMBODIMENTS

Figure 1:
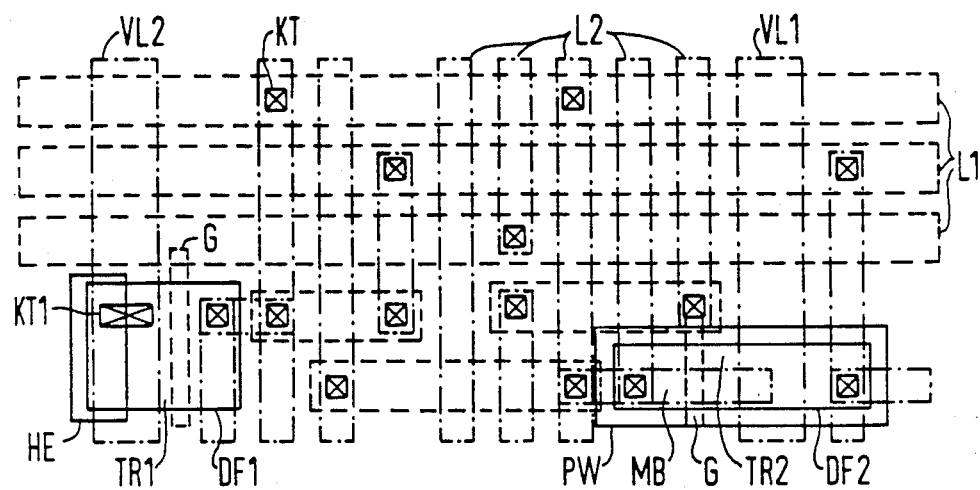
FIG. 1 is a layout of the base cell of the invention.

The structure of the base cell may be observed in FIG. 1. In the illustration, metal is shown with dot-dashed, polysilicon with dashed, and diffusion regions, p-tub, and implantation regions with solid lines.

The base cell comprises two transistors TR1 and TR2. The transistor TR1 thus contains a diffusion region DF1 with acceptor doping. The transistor TR2 contains a diffusion region DF2 with donor doping which is surrounded by a P-tub PW.

The base cell also comprises first interconnects L1 and second interconnects L2. The first interconnects L1 are essentially composed of polysilicon. The second interconnects L2 are essentially composed of metal. The first interconnects L1 and the second interconnects L2 are disposed perpendicular to one another. The second interconnects L2 thus run either between the two transistors TR1 and TR2 or they are conducted over the diffusion region of the transistors TR1 and TR2. The first interconnects L1 essentially run at one side along and parallel to a same side edge of the transistors TR1 and TR2. This side edge is parallel to a source-drain path of the transistor. In this fashion, a wiring path or channel is formed between the transistors TR1 and TR2, the transistors TR1 and TR2 being capable of connection to one another and to terminals at the cell edge via the interconnects of the wiring paths.

In order to be able to vary the transistor width without influencing the cell width, the gates G and associated conducting path of the transistors TR1 and TR2 are conducted parallel to the second interconnects L2. They are connected to an adjacently provided first interconnect L1. The other electrodes of the transistors TR1 and TR2, that is the source and drain, are connected to second interconnects via contacts KT.

The interconnects for the supply voltage VL1 and VL2, i.e. the VDD and VSS supply lines, are positioned between the gate G of the transistors TR1 and TR2 and the cell edge. When an electrical connection between a supply line, for example the supply line VL2, and a transistor electrode, for example the transistor TR1, is provided, then it is preferable to design the corresponding contact as a long contact KT1. With this long contact KT1, a connection to the substrate or to a p-tub can be simultaneously produced via an implantation region HE. When, on the other hand, an inwardly disposed transistor electrode is to be contacted to the supply line, for example to the supply line VL1, then a metal bridge MB is guided over the gate G of the transistor TR2, for example from the supply line VL1 to the transistor electrode.

Low electrode capacitances are achieved by selecting the extent of the transistor electrodes in optimally small fashion, and specifically only of such size as is required for the acceptance of a contact KT. This is shown in the illustrated embodiment of FIG. 1, particularly at the inwardly directed transistor electrodes. Given the outwardly directed transistor electrode of a transistor, for example TR2, which is not contacted to the supply line, the transistor electrode must be selected of such size as is necessary for under-tunneling the supply line and for the acceptance of a contact. The transistor TR2 shows the corresponding solution.

Figure 3:
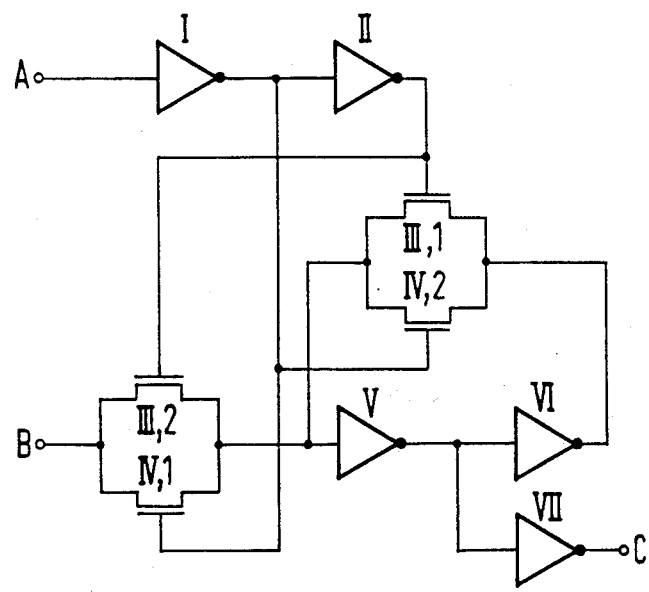
FIG. 3 is a circuit diagram of the bistable circuit according to FIG. 2.

The base cell according to FIG. 1 has a particularly high wiring flexibility. Both the electrical connection between the transistor electrodes of the two transistors TR1 and TR2 via lines L1 and L2 as well as the connection of these transistor electrodes to the cell edge via lines L1 and L2 are possible. Furthermore, the lines L1 and L2 can be connected to one another to a desired degree. Circuits can then be constructed as a result of a side-by-side disposition of a plurality of such base cells and by means of a corresponding electrical connection of the base cells. FIG. 2 and FIG. 3 show an example of such a circuit.

FIG. 3 shows the electrical circuit diagram which shows a bistable circuit whose feedback is disconnectible. This bistable circuit is also referred to as a latch. The individual base cells which are employed for the construction of the circuit are specified with Roman numerals which appear again in FIG. 2. According to FIG. 2 and FIG. 3, the circuit is thus composed of a first inverter I which is connected to an input A and whose output is connected to a second inverter II. The outputs of the inverters I and II are connected to the base cells III and IV in the fashion shown in FIG. 3. The individual transistors of the base cells III and IV have their controlled paths lying parallel to one another in accordance with FIG. 3. Their gate terminals are connected to the output of the respective inverters I and II. Inverters V and VI are also provided, these respectively encompassing one base cell. A driver VII is likewise provided as a base cell. The output is formed by the line C.

In the bistable circuit according to FIG. 3, a binary value adjacent to the input V is stored when a signal is adjacent to the input A. This binary value can be taken at the output C.

How the connection of the individual base cells or of the transistors of the individual base cells occurs via first interconnects L1 and second interconnects L2 may be derived from FIG. 2. The second interconnects are thus either positioned between the transistors of the base cells or run, for example as supply lines VL1 and VL2, over the diffusion regions of the transistors of the base cells. It may further be observed in FIG. 2 that the contacts between the supply lines VL1 or VL2 and the transistor electrodes are provided as long contacts which are simultaneously connected to the substrate or to the p-tub via implantation regions HE. It may further be observed that a plurality of contacts can be provided per transistor in order to reduce the connection resistance of the transistors. This is particularly achieved by means of the parallel arrangement of the transistor gates with the second interconnects L2.

In the illustration of FIG. 2, the individual interconnects L1 and L2 and the remaining regions such as diffusion regions, p-tub and implantation regions are shown with solid lines.

Although various minor changes and modifications might be proposed by those skilled in the art, it will be understood that we wish to include within the claims of the patent warranted hereon all such changes and modifications as reasonably come within our contribution to the art.

We claim as our invention:

1. A CMOS integrated circuit, comprising:
   a plurality of base cells each base cell having
   a first transistor of first channel type, having source and drain regions of first conductivity type located in a second conductivity type portion of a semiconductor substrate, and a gate electrode located between the source and drain regions of first conductivity type;
   a second transistor of second channel type, having source and drain regions of second conductivity type located in a tub of first conductivity type in said semiconductor substrate, and a gate electrode located between the source and drain regions of second conductivity type, a direction from the source region to the drain region of the first transistor being parallel to a direction from the source region to the drain region of the second transistor;
   a plurality of said base cells each having a plurality of first polysilicon interconnects positioned parallel to the direction from the source region to the drain region of each transistor, and each having a plurality of second metal interconnects positioned perpendicular to and crossing said first interconnects but insulated therefrom except at selected contact locations where a contact is desired at a cross point;
   said base cells being arranged adjacent each other in a direction perpendicular to said direction from the source region to the drain region of said base cells, said direction from the source region to the drain region of each cell being parallel to said direction from the source region to the drain region of the adjacent cells;
   at least one of said second metal interconnects in at least one of said base cells running perpendicular to the direction from the source region to the drain region of the transistors of that base cell, being positioned between the first and second transistors of that base cell, and extending from a position between the transistors of the adjacent cell on one side of that base cell to a position between the transistors of the adjacent cell on the other side of that base cell;
   at least one other of said second metal interconnects being a power supply line and extending over one of the source or drain regions of the first transistor of each base cell; and at least one further second interconnect being a second power supply line and extending over one of the source or drain regions of the second transistor of each base cell.

2. A circuit according to claim 1 wherein all first polysilicon interconnects in at least one of said base cells are positioned to one side only of the first and second transistors.

3. A circuit according to claim 1 wherein a metal bridge extends from one of the power supply lines from a position at which the power supply line overlies one of the source or drain regions of one of the transistors in at least one of the cells, over the gate of that transistor, to connect to the other one of the source or drain regions of said transistor.

4. A circuit according to claim 1 wherein at least one of the first and second transistors has an implant region means for contact to one of the substrate or the tub in the substrate.

5. A base cell according to claim 1 wherein the gate electrode and an associated connecting path thereof of at least one of the transistors extends and contacts with a first polysilicon interconnect which is closest to that transistor.

6. A base cell according to claim 1 wherein said second metal interconnect power supply lines have a width greater than all other second metal interconnects in the base cell.

* * * * *